(12) United States Patent
Cardona et al.

(10) Patent No.: US 12,620,961 B2
(45) Date of Patent: May 5, 2026

(54) PATTERNED CAVITY WALLS FOR TRANSVERSELY-EXCITED FILM BULK ACOUSTIC RESONATOR FRONTSIDE MEMBRANE RELEASE

(71) Applicant: Murata Manufacturing Co., Ltd., Nagaokakyo (JP)

(72) Inventors: Albert Cardona, Santa Barbara, CA (US); Chris O'Brien, San Diego, CA (US); Akanksha Saha, Santa Barbara, CA (US); Andrew Kay, Provo, UT (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1008 days.

(21) Appl. No.: 17/831,381

(22) Filed: Jun. 2, 2022

(65) Prior Publication Data

US 2023/0034595 A1     Feb. 2, 2023

Related U.S. Application Data

(60) Provisional application No. 63/228,058, filed on Jul. 31, 2021.

(51) Int. Cl.
H03H 9/02          (2006.01)
(52) U.S. Cl.
CPC ............................... H03H 9/02228 (2013.01)
(58) Field of Classification Search
CPC .. H03H 9/02228; H03H 3/02; H03H 9/02015; H03H 9/02157; H03H 9/174; H03H 9/564; H03H 2003/021

(Continued)

(56) References Cited

U.S. PATENT DOCUMENTS

| | | | |
|---|---|---|---|
| 5,204,575 A | 4/1993 | Kanda et al. | |
| 5,274,345 A | 12/1993 | Gau | |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Andrea Lindgren Baltzell
*Assistant Examiner* — Victor Cole
(74) *Attorney, Agent, or Firm* — ARENTFOX SCHIFF LLP

(57)          ABSTRACT

Acoustic resonator devices and methods are disclosed. An acoustic resonator device includes a substrate having a front surface and an intervening oxide layer on the front surface and having a cavity. A thickness of the intervening oxide layer defines a depth of the cavity, and the substrate has vertical etch-stop material for etching the intervening oxide layer. Lateral fences formed in the intervening oxide layer define a perimeter of the cavity. The lateral fences has a lateral etch-stop material for etching the intervening oxide layer. A single-crystal piezoelectric plate has a back surface attached to the front surface of the intervening oxide layer except for a portion of the piezoelectric plate forming a diaphragm that spans the cavity. An interdigital transducer is formed on the front surface of the single-crystal piezoelectric plate such that interleaved fingers of the IDT are disposed on the diaphragm.

6 Claims, 9 Drawing Sheets

SECTION A-A

©2022 RESONANT INC.

(58) Field of Classification Search
USPC ........................... 310/311, 324; 333/186–187
See application file for complete search history.

(56) References Cited

U.S. PATENT DOCUMENTS

| | | | |
|---|---|---|---|
| 5,446,330 A | 8/1995 | Eda et al. | |
| 5,552,655 A | 9/1996 | Stokes et al. | |
| 5,726,610 A | 3/1998 | Allen et al. | |
| 5,729,186 A | 3/1998 | Seki et al. | |
| 5,853,601 A | 12/1998 | Krishaswamy | |
| 6,172,582 B1 | 1/2001 | Hickernell | |
| 6,271,617 B1 | 8/2001 | Yoneda et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,009,468 B2 | 3/2006 | Kadota et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,476,469 B2 | 11/2019 | Gong et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 2002/0079986 A1 | 6/2002 | Ruby et al. | |
| 2002/0130736 A1 | 9/2002 | Mukai | |
| 2002/0158714 A1 | 10/2002 | Kaitila et al. | |
| 2002/0189062 A1 | 12/2002 | Lin et al. | |
| 2003/0042998 A1 | 3/2003 | Edmonson | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0261250 A1 | 12/2004 | Kadota et al. | |
| 2005/0077982 A1 | 4/2005 | Funasaka | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0152107 A1 | 7/2006 | Tanaka | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0060838 A1* | 3/2008 | Chen | H05K 3/4682 174/262 |
| 2008/0246559 A1 | 10/2008 | Ayazi | |
| 2010/0019866 A1 | 1/2010 | Hara et al. | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0254406 A1 | 10/2011 | Yamane | |
| 2011/0278993 A1 | 11/2011 | Iwamoto | |
| 2012/0073390 A1 | 3/2012 | Zaghloul et al. | |
| 2012/0198672 A1 | 8/2012 | Ueda et al. | |
| 2012/0286900 A1 | 11/2012 | Kadota et al. | |
| 2012/0326809 A1 | 12/2012 | Tsuda | |
| 2013/0127551 A1 | 5/2013 | Yamanaka | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0014795 A1 | 1/2015 | Franosch | |
| 2015/0042417 A1 | 2/2015 | Onodera et al. | |
| 2015/0165479 A1 | 6/2015 | Lasiter et al. | |
| 2015/0319537 A1 | 11/2015 | Perois et al. | |
| 2015/0333730 A1 | 11/2015 | Meltaus et al. | |
| 2015/0365067 A1 | 12/2015 | Hori et al. | |
| 2016/0028367 A1 | 1/2016 | Shealy | |
| 2016/0087187 A1 | 3/2016 | Burak | |
| 2016/0182009 A1 | 6/2016 | Bhattacharjee | |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |
| 2017/0370791 A1 | 12/2017 | Nakamura et al. | |

(56) References Cited

U.S. PATENT DOCUMENTS

| | | |
|---|---|---|
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0190487 A1 | 6/2019 | Yasuda |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0083861 A1 | 3/2020 | Matsuo |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0350891 A1 | 11/2020 | Turner |
| 2020/0412328 A1* | 12/2020 | Turner .................... H10N 30/06 |
| 2021/0013859 A1 | 1/2021 | Turner et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja. 4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Wu et al., "Frequency band-gap measurement of two-dimensional air/silicon phononic crystals using layered slanted finger interdigital transducers", J. Appl. Phys. 97, 094916, 2005 (Year: 2005).

(56) References Cited

OTHER PUBLICATIONS

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

* cited by examiner

©2022 RESONANT INC.
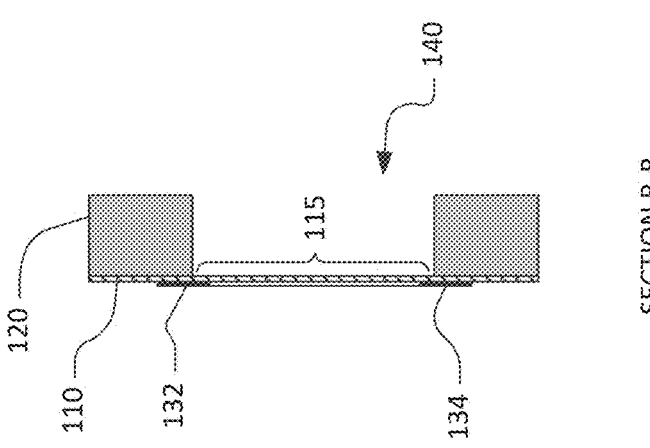
SECTION B-B
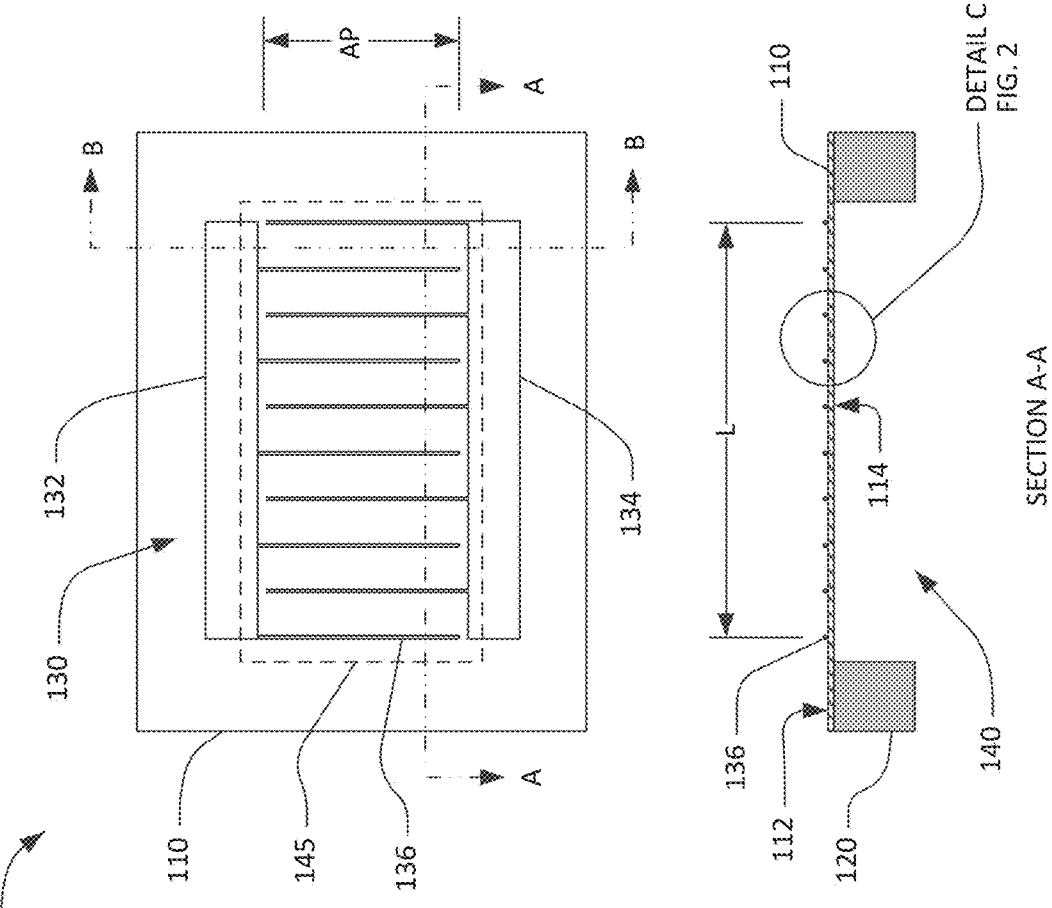
SECTION A-A
DETAIL C
FIG. 2
FIG. 1

©2022 RESONANT INC.

DETAIL C

©2022 RESONANT INC.

©2022 RESONANT INC.

Note: only one of actions 410A, 410B, 410C is performed in each of three variations of the process 400.

© 2022 RESONANT INC.

© 2022 RESONANT INC.

©2022 RESONANT INC.

© 2022 RESONANT INC.

PATTERNED CAVITY WALLS FOR TRANSVERSELY-EXCITED FILM BULK ACOUSTIC RESONATOR FRONTSIDE MEMBRANE RELEASE

RELATED APPLICATION INFORMATION

This patent claims priority from and incorporates by reference Provisional Application No. 63/228,058, filed Jul. 31, 2021, entitled PATTERNED CAVITY WALLS FOR XBAR FRONTSIDE MEMBRANE RELEASE.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators and to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are N77, which uses the frequency range from 3300 MHz to 4200 MHz, and N79, which uses the frequency range from 4400 MHz to 5000 MHz. Both band N77 and band N79 use time-division duplexing (TDD), such that a communications device operating in band N77 and/or band N79 use the same frequencies for both uplink and downlink transmissions. Bandpass filters for bands N77 and N79 must be capable of handling the transmit power of the communications device. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 1 includes a schematic plan view and two schematic cross-sectional views of a transversely-excited film bulk acoustic resonator (XBAR).

Figure 2:
FIG. 2 is an expanded schematic cross-sectional view of a portion of the XBAR of FIG. 1.
Figure 2:
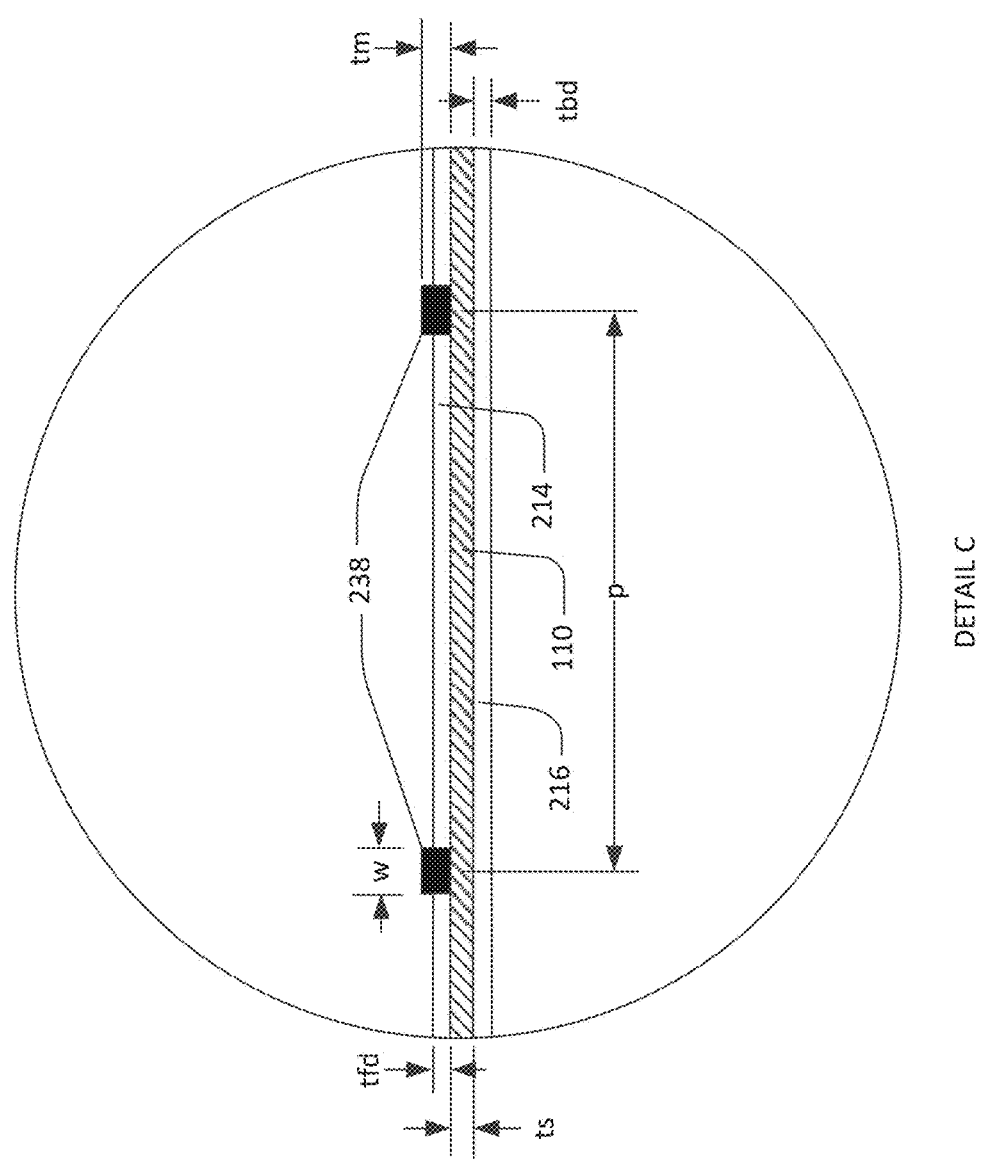

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

The Transversely-Excited Film Bulk Acoustic Resonator (XBAR) is a resonator structure for use in microwave filters. The XBAR is described in U.S. Pat. No. 10,491,291, titled TRANSVERSELY EXCITED FILM BULK ACOUSTIC RESONATOR, which is incorporated herein by reference. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer formed on a diaphragm or membrane.

XBAR fabrication processes may be divided into two broad categories known as "the front-side etch option" or a frontside membrane release (FSMR) and the "backside etch option" or a backside membrane release (BSMR). With the front-side etch option, the piezoelectric plate is attached to a substrate and the diaphragm portion of the piezoelectric plate floats over a cavity (the "swimming pool") formed by etching the substrate or a sacrificial material using an etchant introduced through holes in the piezoelectric plate. With the backside etch option, the piezoelectric plate is attached to a substrate and the diaphragm portion of the piezoelectric plate floats over a void etched through the substrate from the back side (i.e., the side opposite the piezoelectric plate).

Described herein are devices having and methods of forming XBARs with patterned cavity walls for FSMR of the plate, such as after an IDT has been formed. The patterned cavity walls may be part of a front-side etch fabrication option in which an etch stop is formed around the cavity by first forming slots around a perimeter of the cavity and filling the slots with an etch-stop material. The etch-stop material may be, for example, metal. The patterned cavity walls may use lateral fences to bound the horizontal width and length of the cavities; and an implanted intervening oxide layer may bound the vertical depth of the cavities when the cavities are etched under the membrane through holes in the membrane.

For example, for XBAR resonators that require free-floating LiNbO3 (LN) membranes released from the Silicon handle wafer the BSMR includes backside photolithographic patterning of the Si wafer and a dry etching technique to remove the Si material, while the FSMR utilizes a patterned and filled cavity inside the Si wafer prior to LN bonding. The membrane release technique for the BSMR process is a time-consuming process which takes ~1-2 hrs, while the FSMR cavity etch process is typically <30 mins. The FSMR process has additional advantages over the BSMR process in terms of efficiency and control of the membrane release step and the reliability of a closed membrane cavity versus an open cavity of the BSMR. However, while the BMSR can use blank substrates and can pattern and fabricate any membrane configuration, the FSMR requires pre-patterned substrates that are design specific. This limits the usefulness of these substrates to only similar designs. This invention enables the flexibility of BSMR patterning and fabricating any membrane configuration on blank substrates and maintaining the advantages of FSMR.

To solve these problems, the embodiments herein utilize the FSMR process and will not require a patterned, filled cavity to define the membrane area. Instead, some embodiments use an ion-milling process that drills elongated holes (e.g., walls or trenches) in the LN substrate down to the Si wafer. These walls or trenches define the membrane area or perimeter. A second set of LN holes (e.g., etch holes for etching the cavity) within the wall holes are ion-milled when the elongated holes are milled. A layer of metal (e.g., Cr/Au/Pt) are deposited to fill the wall holes and form fences that define the perimeter of the cavities. This metal layer will act as the horizontal etch stop during the etching process to release the membrane. The substrate material may act as the vertical etch stop during the etching process to release the membrane.

Description of Apparatus

FIG. 1 shows an XBAR 100 made up of a thin film conductor pattern formed on a surface of a piezoelectric plate 110 having parallel front and back surfaces 112, 114, respectively. The piezoelectric plate 110 is a thin single-crystal layer of a piezoelectric material such as lithium niobate (LN), lithium tantalate (LT), lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX), SiO2, Diamond, SiOC, Si3N4, Tungsten (W) and crystalline silicon. The back surface 114 of the piezoelectric plate 110 or a diaphragm 115 including the plate may be bonded to the substrate 120 using a wafer bonding process, or grown on the substrate 120, or attached to the substrate in some other manner. The piezoelectric plate may be attached directly to the substrate or may be attached to the substrate via one or more intermediate material layers, such as a bonding oxide (BOX) layer that may be SiO2.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIGS. 3A-3B and 5C-5C). The cavity 140 may be formed, for example, by selective etching of the substrate 120 before or after the piezoelectric plate 110 and the substrate 120 are attached.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm"

115 (for lack of a better term) due to its physical resemblance to the diaphragm of a microphone. The diaphragm 115 may be continuously and seamlessly connected to the rest of the piezoelectric plate 110 around all, or nearly all, of perimeter 145 of the cavity 140. In this context, "contiguous" means "continuously connected without any intervening item". The IDT 130 is positioned on the piezoelectric plate 110 such that at least the fingers 136 of the IDT 130 are disposed on the diaphragm 115 of the piezoelectric plate that spans, or is suspended over, the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

FIG. 2 shows a detailed schematic cross-sectional view (detail C) of the XBAR 100 of FIG. 1. The cross-sectional view may be a portion of the XBAR 100 that includes fingers of the IDT. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g., bands N77, N79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thickness of the front side dielectric layer.

Further, a passivation layer may be formed over the total surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of one or more oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 110. The width of the IDT fingers in an XBAR is not constrained to one-fourth of the acoustic wavelength at resonance. For example, the width w of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figures 3A, 3B:
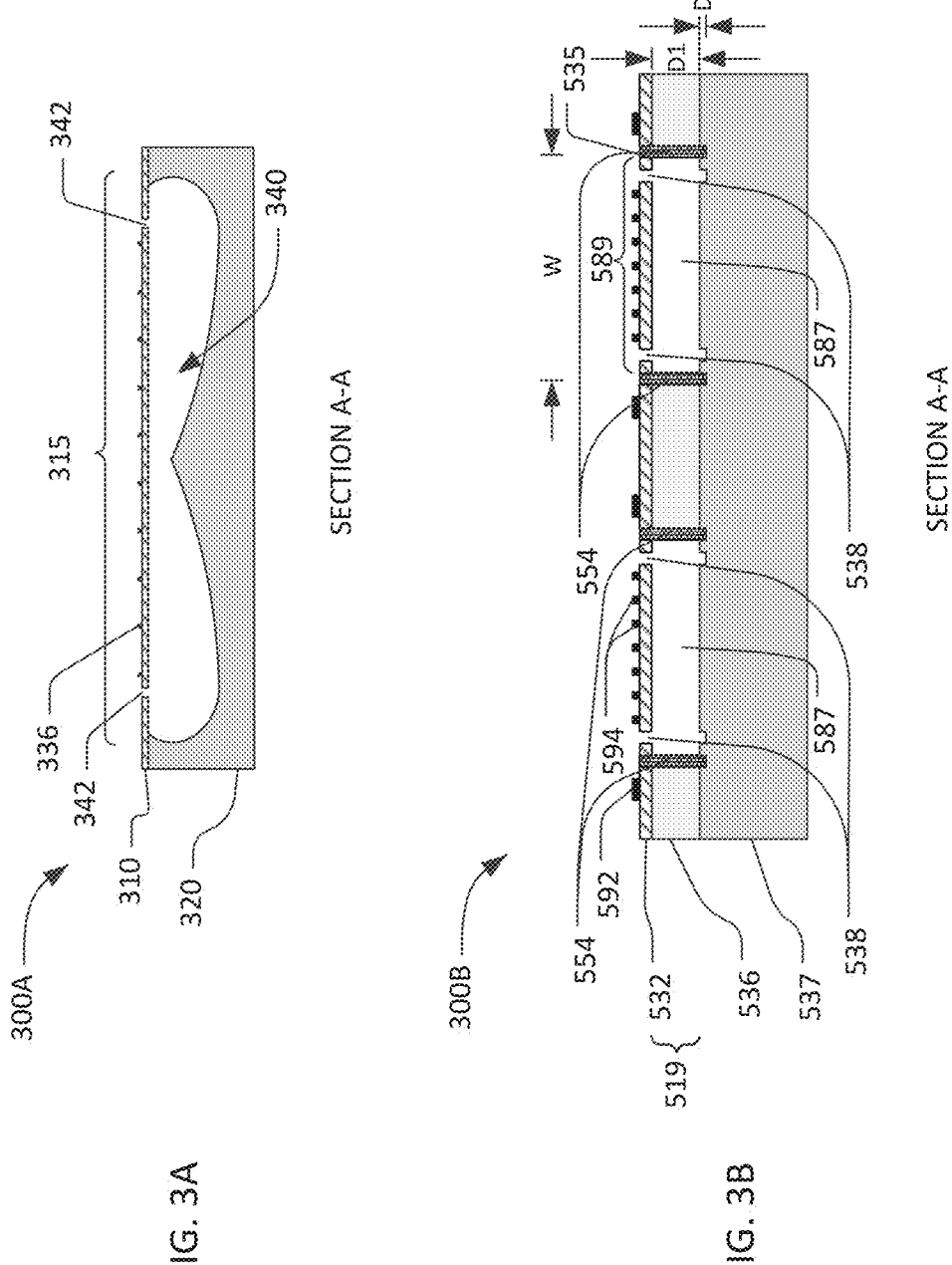
FIG. 3A is an alternative schematic cross-sectional view of an XBAR.
FIG. 3B is another alternative schematic cross-sectional view of an XBAR.

FIG. 3A and FIG. 3B show alternative schematic cross-sectional views of resonator devices 300A and 300B along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers, such as finger 336, of an IDT are disposed on the diaphragm 315. The cavity 340 may be formed by etching the substrate 320 with a selective etchant that reaches the substrate through one or more openings 342 provided in the piezoelectric plate 310.

FIG. 3A illustrates problems that occur when the cavity is formed by etching the substrate 320 with a selective etchant that reaches the substrate through the openings 342 in the piezoelectric plate 310. The process used to form the cavity 340 will introduce a liquid or gaseous etchant via the holes 342. This etchant will etch isotropically, causing the cavity to expand in all directions from the holes 342. The resulting cavity will effectively increase the area of the diaphragm 315 beyond the area occupied by the IDT. Resistive and acoustic losses in the IDT during use generate heat in the diaphragm. Enlarging the diaphragm area beyond the area of the IDT increases the difficulty of removing the heat from the diaphragm. Further, the bottom of the cavity 340 will not be parallel to the piezoelectric plate 310. The deepest portions of the cavity will be proximate the holes 342 and the minimum depth of the cavity will occur near the center of the diaphragm 315.

The shape of the cavity in FIG. 3A is an artistic rendition of the potential problems with etching the cavity 340 with an etchant introduced through holes in the piezoelectric plate 310. The illustrated shape of the cavity is not based on simulation or measurement of an actual etching process.

In FIG. 3B, device 300B is shown with two acoustic resonators having cavities 587 formed with a patterned cavity walls substrate for FSMR of their piezoelectric plate membranes. The patterned cavity walls use lateral fences 554 to bound the horizontal width and length of the cavities, and use an intervening oxide layer 536 and substrate 537 to bound the vertical depth of the cavities when the cavities are etched under the membrane 589 through holes 538 in the membrane.

For device 300B a piezoelectric plate 532 is attached to a substrate 537, such as to intervening oxide layer 536 formed on intervening oxide layer 536 in device portion 519 of the substrate. The intervening oxide layer 536 may be disposed between and in contact with the back surface of the piezoelectric plate 532 and the front surface of the substrate layer 537. In some cases, a bonding oxide layer is between the intervening oxide layer and the piezoelectric plate.

Portions of the piezoelectric plate 532 form diaphragms 589 spanning cavities 587 in the intervening oxide layer 536 and to the substrate 537. The cavities 587 do not fully penetrate the substrate 537. Fingers, such as finger 594, of an IDT of a conductor pattern 592 are disposed on the diaphragms. The cavities 587 have been formed by etching the intervening oxide layer 536 of device portion 519 and/or cavity location with a selective etchant that reaches the intervening oxide layer 536 through one or more holes 538 in the piezoelectric plate 532. The lateral extent of the cavities 587 is defined by lateral fences 554, where "lateral" is defined as a direction parallel to the surfaces of the piezoelectric plate 532. Each of lateral fences 554 may be a vertical 'fence' feature formed by an etch of the plate 532 and intervening oxide layer 536; then a deposition of an etch stop material such as SiO2, silicon nitride, aluminum oxide, oxynitride or another etch stop material with respect to the substrate. This etch stop material may be a metal such as Cr, Au, Pt or a combination thereof. It may be Cr/Au/Pt, such as in equal amounts, or not in equal amounts.

The substrate 537, the plate 532, the conductor pattern 592, the fingers 594, the cavity 587, the diaphragm 589 and/or the perimeter 535 may be similar to descriptions of similar features for FIGS. 1, 2 and/or 3. The intervening oxide layer 536 may be on the substrate front surface, have cavity 587 and have a thickness that defines a depth D1 of the cavity. The substrate 537 may be a vertical etch-stop material for etching the intervening oxide layer 536. Lateral fences 554 in the plate 532 and in the intervening oxide layer 536 define a perimeter 535 of the cavity 587, the lateral fences 554 comprising a lateral etch-stop material for etching the intervening oxide layer 536 and that is different from the intervening oxide layer material. Plate 532 may be a single-crystal piezoelectric plate having opposing front and back surfaces, the back surface attached to the front surface of the intervening oxide layer 516 except for a portion of the piezoelectric plate forming a diaphragm 589 that spans the cavity 587. An interdigital transducer (IDT) of conductor pattern 592 is formed on the front surface of the single-crystal piezoelectric plate such that interleaved fingers 594 of the IDT are disposed on the diaphragm 589. The intervening oxide layer 536 may be or have a device layer thickness of silicon oxide material formed on a silicon substrate 537.

The piezoelectric plate 532 and the IDT are configured such that a radio frequency signal applied to the IDT excites a primary shear acoustic mode in the diaphragm. The piezoelectric plate 532 may be lithium niobate and/or lithium tantalate. Device portion 519 may be parts of the intervening oxide layer 536, and the cavity 587 may extend from the back surface of the piezoelectric plate 532 though the device portion to the substrate 537. In some cases, the substrate is silicon, the intervening oxide layer is silicon dioxide, and the lateral fences are metal. In some cases, the cavity is formed by a frontside membrane release etch process that etches the intervening oxide layer 516; and the lateral fences and substrate are substantially impervious to the etch process.

The lateral fences 554 and the substrate 537 may be formed of different etch-stop materials, all of which are substantially impervious to the process and etchant used to etch layer 536. The lateral fences 554, and the substrate 537 may be materials that are not etched by the etch process used to form the cavities, or that are etched sufficiently slowly that the fences constrains the lateral extent of the cavities and the vertical substrate 537 defines the depth of the cavities. When the substrate 537 is silicon, the etchant may be, for example, $XeF_2$. The cavities 587 may be formed by a FSMR frontside membrane release etch process.

While the lateral fences 554 are shown in cross-section with lateral width W1 in FIG. 3B, it should be understood that the lateral fences 554 may each be a continuous closed band of etch-stop material that surrounds a and/or forms a perimeter 535 around a cavity 587 such that the lateral fences also defines the size of each cavity 587 in the direction normal to the plane of the drawing. The fences may also have gaps in their closed band or perimeter 535 such as shown in view 620 of FIG. 6A. Each cavity extends from the back surface of the piezoelectric plate 532 though the device portion 519 to the substrate 537.

The vertical extent or depth D1 of the cavities 587 is defined by a vertical intervening oxide layer 536 depth D1. The intervening oxide layer 536 may be a horizontal layer feature formed by deposition or other forming of the intervening oxide layer 536 on the substrate. The intervening oxide layer 536 may form a layer that is intervening with depth D1 between the plate and substrate. The vertical intervening oxide 536 may be a horizontal 'box' feature, which can be formed through deposition or wafer bonding. The cavities 587 may have a rectangular, or nearly rectangular, cross section. In this patent, the term vertical means a direction perpendicular to the surface of the substrate or piezoelectric plate.

Description of Methods

Figure 4:
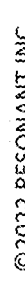
FIG. 4 is a flow chart of a process for fabricating an XBAR.
Figure 4:
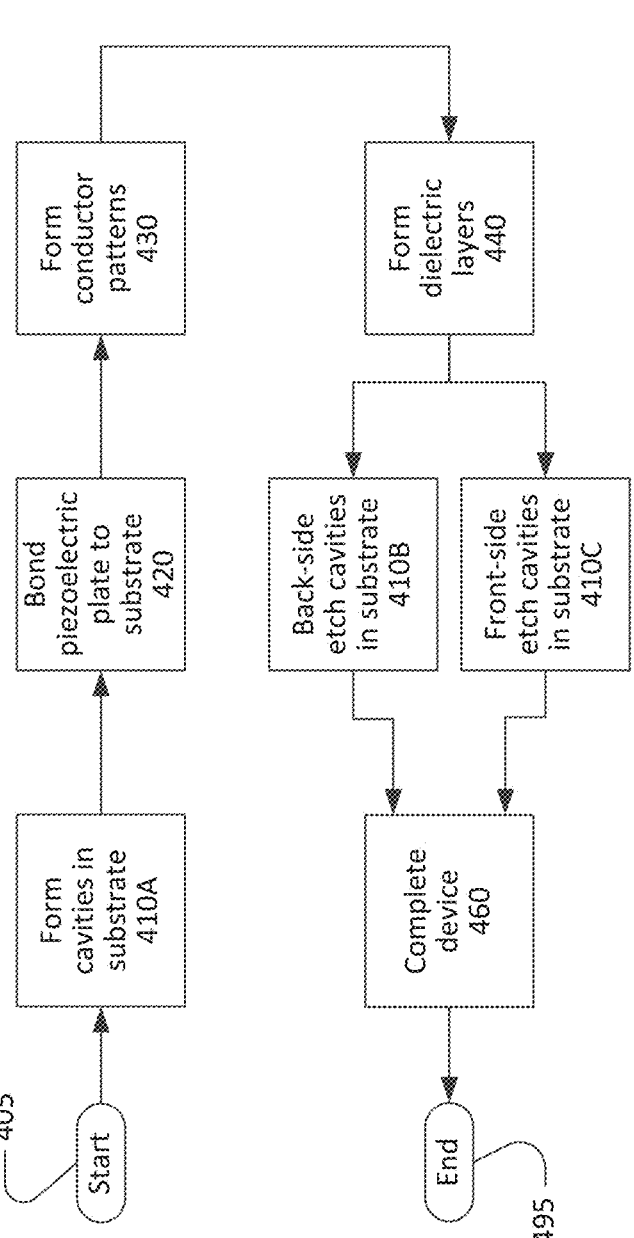

FIG. 4 is a simplified flow chart showing a process 400 for making an XBAR or a filter incorporating XBARs. The process 400 starts at 405 with a substrate and a plate of piezoelectric material and ends at 495 with a completed XBAR or filter. The completed device at 460 or 495 may be resonator device 300A. As will be described subsequently, the piezoelectric plate may be mounted on a sacrificial substrate or may be a portion of wafer of piezoelectric material. The flow chart of FIG. 4 includes only major process steps. Various conventional process steps (e.g., surface preparation, cleaning, inspection, deposition, photolithography, baking, annealing, monitoring, testing, etc.) may be performed before, between, after, and during the steps shown in FIG. 4.

The flow chart of FIG. 4 captures three variations of the process 400 for making an XBAR which differ in when and how cavities are formed in the substrate. The cavities may be formed at steps 410A, 410B, or 410C. Only one of these steps is performed in each of the three variations of the process 400.

The piezoelectric plate may be, for example, Z-cut, rotated Z-cut, or rotated Y-cut lithium niobate or lithium tantalate. The piezoelectric plate may be some other material and/or some other cut. The substrate may be silicon. The substrate may be some other material that allows formation of deep cavities by etching or other processing.

In one variation of the process 400, one or more cavities are formed in the substrate at 410A, before the piezoelectric plate is bonded to the substrate at 420. A separate cavity may be formed for each resonator in a filter device. The one or more cavities may be formed using conventional photolithographic and etching techniques. For example, the cavities may be formed using deep reactive ion etching (DRIE). Typically, the cavities formed at 410A will not penetrate through the substrate, and the resulting cavities will have a cross-section as shown in FIG. 3A.

At 420, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide, a bonding layer or other dielectric, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 420, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 420 starts with a single-crystal piezoelectric wafer. Ions are implanted to a controlled depth beneath a surface of the piezoelectric wafer (not shown in FIG. 4). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 430. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 430 by depositing the conductor layers over the surface of the piezoelectric plate and removing excess metal by etching through patterned photoresist. Alternatively, the conductor patterns may be formed at 430 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern.

At 440, one or more dielectric layers may be formed by depositing one or more layers of dielectric material on the front side of the piezoelectric plate. The dielectric layers may be, for example, silicon dioxide, silicon nitride, or some other material. The dielectric layers may be deposited using conventional techniques such as sputtering or chemical vapor deposition. The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device In a second variation of the process 400, one or more cavities are formed in the back side of the substrate at 410B after all the conductor patterns and dielectric layers are formed at 430. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 400, one or more cavities in the form of recesses in the substrate may be formed at 410C by etching the substrate using an etchant introduced through openings in the piezoelectric plate. A separate cavity may be formed for each resonator in a filter device. The one or more cavities formed at 410C will not penetrate through the substrate, and the resulting resonator devices will have a cross-section as shown in FIG. 3A.

In all variations of the process 400, the filter device is completed at 460. Actions that may occur at 460 include depositing an encapsulation/passivation layer such as silicon oxide or silicon nitride over all or a portion of the device and/or forming bonding pads or solder bumps or other means for making connection between the device and external circuitry if these steps were not performed at 430. Other actions at 460 may include excising individual devices from a wafer containing multiple devices; other packaging steps; and testing. Another action that may occur at 460 is to tune the resonant frequencies of the resonators within the device by adding or removing metal or dielectric material from the front side of the device. After the filter device is completed, the process ends at 495.

Forming the cavities at 410A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 410B requires additional handling inherent in two-sided wafer processing. Forming the cavities from the back side also greatly complicates packaging the XBAR devices since both the front side and the back side of the device must be sealed by the package.

Forming the cavities by etching from the front side at 410C does not require two-sided wafer processing and has the advantage that the XBAR diaphragms are supported during all of the preceding process steps. However, an etching process capable of forming the cavities through openings in the piezoelectric plate will necessarily be isotropic. As illustrated in FIG. 3A, such an etching process will etch laterally (i.e., parallel to the surface of the substrate) as well as etching normal to the surface of the substrate. It may be difficult to control the lateral extent and shape of cavities etched in this manner. It is desired to control such an etching process, such as using etch stops or barriers.

Figure 5A:
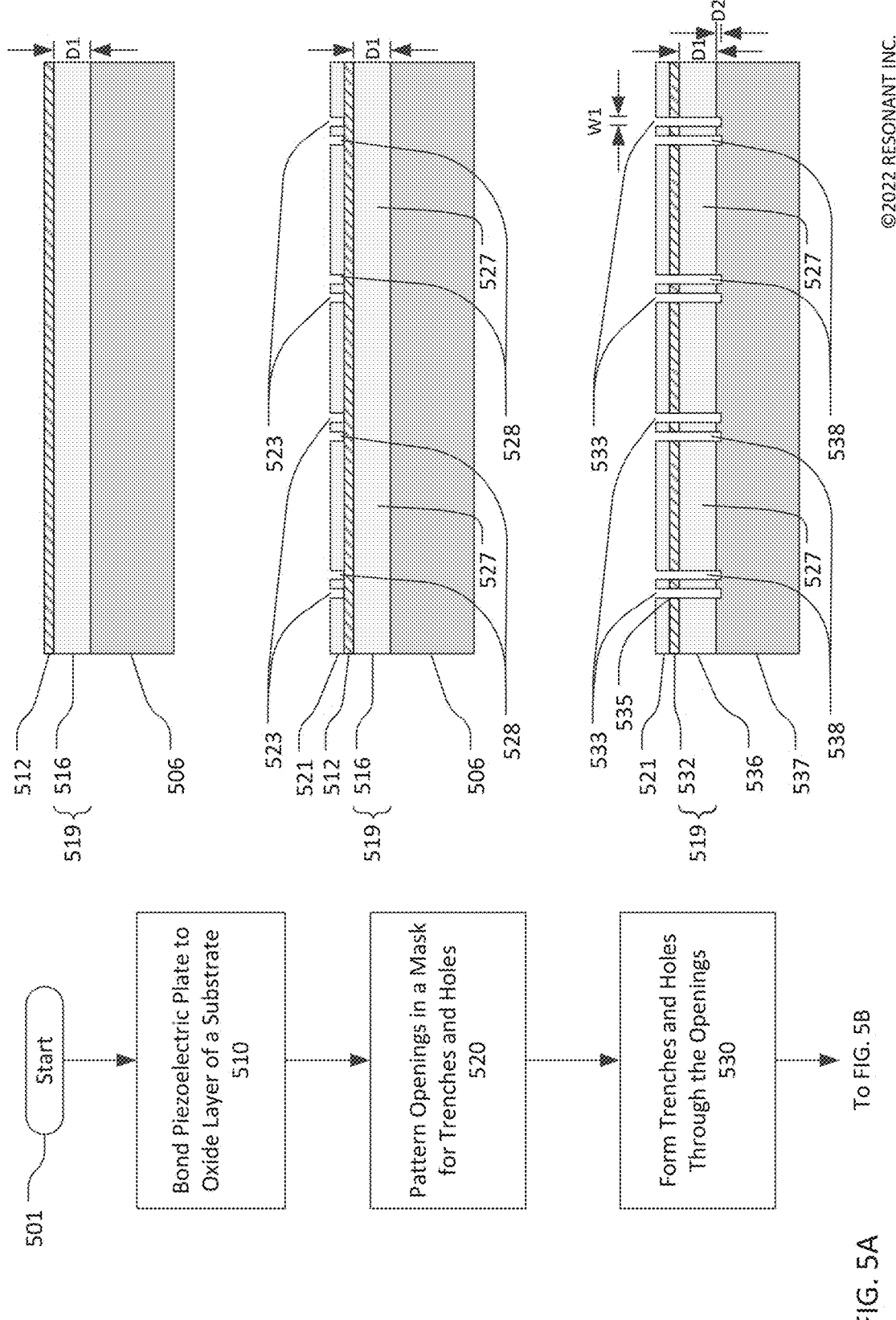
FIG. 5A, FIG. 5B and FIG. 5C (collectively "FIG. 5") are a flow chart of another process for fabricating an XBAR using lateral fences.
Figure 5B:
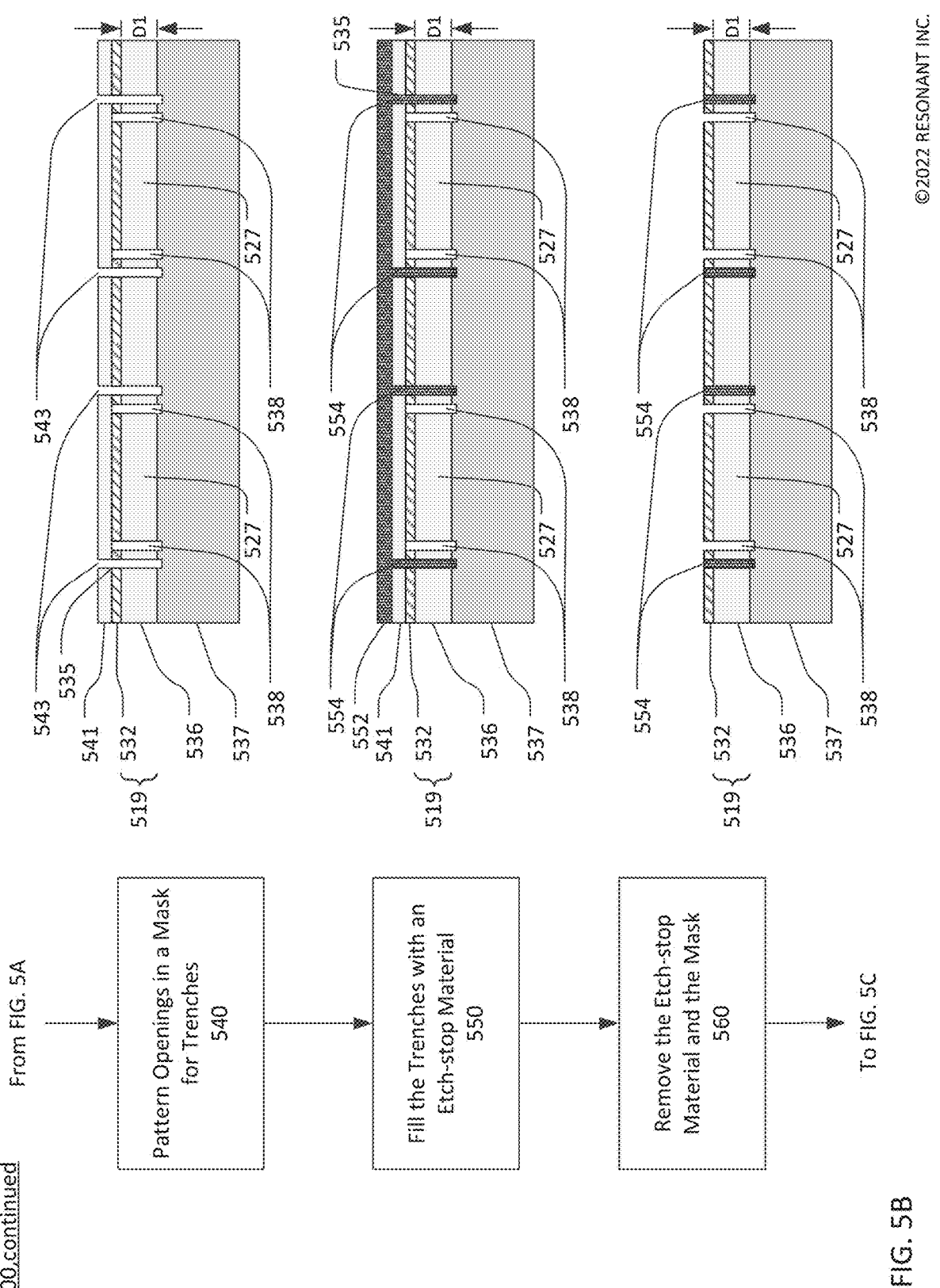
Figure 5C:
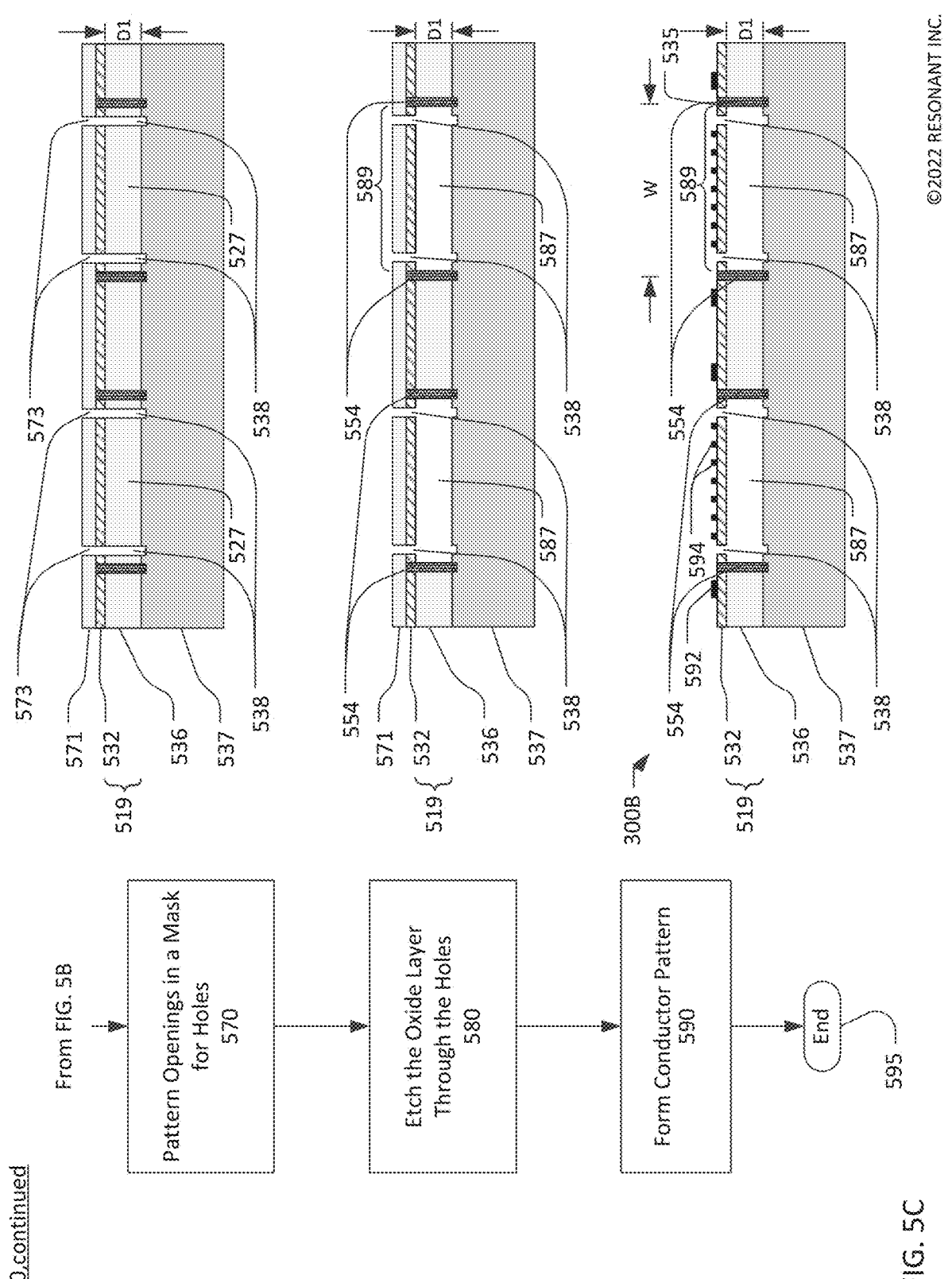

FIG. 5A, FIG. 5B, and FIG. 5C are a simplified flow chart of another process 500 or method for fabricating an acoustic resonator device or an XBAR. The process 500 uses both lateral fences and a vertical intervening oxide (for example, lateral fences 554 and vertical intervening oxide 536 in FIG. 3B). Process 500 may replace process 400. Process 500 may be a FSMR process using patterned cavity walls.

To the right of each action in the flow chart is a schematic cross-sectional view representing the end of each action. The process 500 starts at step 501 in FIG. 5A and ends at step 595 in FIG. 5C with a completed resonator or filter device. The completed device at 580 or 595 may be resonator device 300B. The flow chart of FIG. 5 includes only major process steps. Various conventional process steps (e.g., surface preparation, cleaning, inspection, deposition, photolithography, baking, annealing, monitoring, testing) may be performed before, between, after, and during the steps shown in FIG. 5.

After start 501, the process 500 continues to step 510 with bonding a piezoelectric plate 512 to a substrate 506 with an intervening oxide layer 516. The oxide layer 516 may be subsequently etch at desired locations for cavities to form on or more cavities in the substrate. This etch may use the oxide layer as a vertical etch stop. The oxide layer 516 may have a controlled thickness or depth D1 above a top surface of the silicon substrate 506 that is equal to or less than a depth for trenches and holes to be etched through the oxide layer 516. Depth D1 may be greater than or equal to an intended maximum depth of the cavity under a diaphragm of resonators. Substrate 506 may be a substrate as described for substrate 120, substrate 320 or a substrate described for FIG. 4. Substrate 506 may have a thickness of between 250 μm and 500 μm. Substrate 506 may be a Silicon handle wafer.

Substrate 506 may be a high resistivity silicon substrate. A high resistivity silicon substrate may have a resistivity of greater than 1 k Ohm·cm. It may be silicon having resistivity of between 1000 ohm·cm and up to ~10,000 ohm·cm.

Bonding at step 510 may be bonding the plate 512 to a top surface of device portion 519 of layer 516 which will have cavity 587 of the device and upon which device conductor pattern 592 will be formed. Techniques for bonding the piezoelectric plate were previously described for action 420 in the process 400 of FIG. 4.

Plate 512 may be a piezoelectric plate as described for plate 110, plate 532 or a plate described for FIG. 4. Plate 512 may have a thickness of between 250 nm and 500 nm.

Layer 516 is a buried or intervening oxide layer of dielectric or electrically insulating material. Layer 516 is a material that can be selectively etched with respect to material of fences 554 and substrate 506. Layer 516 may be an intervening oxide layer of a silicon oxide such as SiO2. It may be silicon nitride, aluminum oxide, oxynitride, another dielectric material.

Depth D1 may be the depth of a final XBAR cavity 587. Depth D1 may be between 1 um and 100 um. In some cases, depth D1 is between 1 and 10 um. It may be between 1 um and 5 um.

In some cases, step 510 includes forming a thin bonding layer or oxide (not shown) on the planarized surface of the layer 516. The bonding layer may silicon dioxide or some material capable of bonding to the piezoelectric material (typically lithium niobate or lithium tantalate) to be used in the XBAR. The bonding layer may be formed by a conventional process such as evaporation, sputtering, chemical vapor deposition or molecular beam epitaxy. In this case, the plate is bonded to the bonding layer. The bonding layer may have thickness of between 0.5-2 um.

In some cases, bonding at step 510 includes forming or depositing intervening oxide layer 516 onto substrate 506 prior to bonding the plate 512. Here, forming layer 516 may be forming an intervening oxide layer 516 on a front or top surface of a silicon substrate 506 having opposing front and back surfaces.

Layer 516 may be formed by atomic layer deposition (ALD), physical vapor deposition (PVD) or chemical vapor deposition (CVD). The intervening oxide layer 516 may be a vertical intervening oxide horizontal 'box' feature formed by wafer bonding an insulator or oxide layer on a top surface of substrate 506/537. This may be a silicon on insulator (SOI) technology.

Next, step 520 is a photolithographic patterning of openings 523 and 528 in a mask on the piezoelectric plate 512 to form pattern 521. The pattern 521 may be a photolithography mask having openings that include openings 523 and 528 exposing desired locations for the trenches 533 and holes 538, respectively at desired locations 527 for cavities. Step 520 may be a photolithography process to pattern openings for the trenches and holes. The mask may be a patterned photoresist formed on the plate 512 that is capable of masking/stopping an etch or ion milling process of step 530. The mask may be a suitable mask such as a photoresist mask or a hard mask.

Next, step 530 is a patterned etching through openings 523 and 528 to form the trenches 533 and holes 538, respectively at desired locations 527 for cavities. Step 520 may be etching through the openings 523 and 528, through the piezoelectric plate 512, through the intervening oxide layer 516 and to the substrate 506. Step 530 may be an ion mill of an LiNbO3 (LN) substrate or plate to create thru holes for the trenches and holes to the silicon wafer 506.

The trenches 533 and holes 538 are etched down to and possibly partially into substrate 506. Step 530 may include selectively etching the trenches 533 and holes 538 through the intervening oxide layer 516 using the substrate as an etch stop. Etching the trenches forms trench perimeters 535 of desired cavity locations 527 to a at least a desired depth D1 or thickness of device portion 519. In some cases, this etch extends into the substrate by a depth D2, as shown. The oxide layer 536 has a typical thickness tolerance of +/−10%. For example, an oxide thickness of 1 um will range from 0.9 um to 1.1 um. To ensure a proper seal of the metal cavity wall 550 and the substrate 537, the depth D2 should at least 0.2 um-0.5 um deep. This should be sufficient to cover oxide layer thicknesses from 1 um to 4 um thick.

Step 530 may be a patterned etching that is or includes an ion milling process that drills elongated holes (e.g., trenches and holes) in the piezoelectric plate 532, through the intervening oxide layer 536 and into a depth D2 of but not through the substrate 537 to form the trenches 533 and the holes 538. One example is top perspective view 610 of the rectangular wall trenches 533 and circular holes 538 through pattern 521 shown by FIG. 6A.

The holes 538 may be circular holes or elongated slots or some other shape. As shown in FIG. 6 the holes 538 are within regions encircled by the lateral fences 554.

Trenches 533 are etched at locations for forming lateral fences 562 that will bound intended locations 527 for cavities. Each of trenches 533 may form a two dimensional track or perimeter for a cavity to have a volume in the layer 532. The trenches 533 may be contiguous with the surrounding material of portion 519 outside of the locations 527. While the trenches 533 are only shown in cross-section in FIG. 5A, it must be understood that from a top perspective (e.g., see view 610 of FIG. 6A), each trench is a ring, square, rectangle or other surface shape completely around the perimeter of what will become a cavity. One example is top perspective view 610 of large rectangular cavity location 527 between rectangular wall trenches 533 and having circular holes 538 in FIG. 6A.

Etching at step 530 may include etching trenches having a width W1 of between 0.1 um and 10 um between the trench inside surface and a trench outside surface. Width W1 may be between 0.5 um and 1.5 um.

In some cases, steps 520 and 530 may including using first mask and etch/milling to form openings 523 or 528; then using a second mask and etch/milling to form the other of openings 528 or 523. Steps 520 and 530 may be forming trenches 533 through the piezoelectric plate 532 and the oxide layer 536 to define a perimeter 535 of a desired location 527 for a cavity 587. Steps 520 and 530 may be forming holes 538 through the piezoelectric plate 532 and the oxide layer 536 within a perimeter 535 of a desired location 527 for a cavity 587. Steps 520 and 530 may be a photolithography process to pattern and etch those trenches and holes.

Next, step 540 is a photolithographic patterning of openings 543 in a mask on the piezoelectric plate 532 to form pattern 541. Pattern 541 covers the locations for the holes 538 but has openings 543 that expose the desired locations for the trenches 533. Patterning at 541 may include first removing pattern 521 prior to patterning pattern 541. The pattern 541 may be a photolithography mask having openings that include openings 543 exposing desired locations for the trenches 533 at desired locations 527 for cavities. The mask may be a patterned photoresist formed on the plate 532 that is capable of masking a fence material deposition of step 550. The mask may be a suitable mask such as a photoresist mask or a hard mask. Step 540 may be a photolithography process prior to depositing a metal wall layer forming the fences.

Step 550 is filling the trenches 533 with an etch-stop material 552. Material 552 may be a metal deposition over the pattern 541, and through the openings 543, through the piezoelectric plate 532, through the intervening oxide layer 536 and to the substrate 537 to form slots or lateral fences 554 that define a perimeter 535 of a location 527 for a cavity. The perimeter may be for a membrane of the plate 532 above the cavity. Etch stop material 552 may form a blanket layer over the mask 541 as well as the fences 554, as shown.

Step 550 may be depositing a metal to fill openings 543 to form the fences 554. The metal may be Cr, Au, Pt or any combination of two or more thereof. It may be Cr/Au/Pt. Other materials that can be used are Al2O3, AlF3, Al, AlSiCu, Ti3Al or any combination of two or more thereof.

Step 560 is removing the metal deposition of material 552 over the pattern 541 and of the second pattern 541. Step 560 may be removing the blanket layer of material 552, such as using by removing mask 541 to expose a front or top surface of the plate 532. Step 560 may be removing photoresist 541 to or and lift-off of metal layer of material 552 above the resist.

Step 560 may also include chemical mechanical polishing (CMP) or another planarizing process to expose a front or top surface of the plate 532 and/or planarize the material 552 within holes 543 to the top surface of the plate 532. For example, after mask 541 is removed, the top surface of the plate 532 may be uneven and/or covered with material used to form the fences and thus may need to be planarized. Planarization may be performed by mechanical polishing, by chemo-mechanical polishing, or some other method to form a planar top surface of plate 532, such as by exposing or creating a planar top surface of plate 532.

Step 550 and/or 560 may be forming lateral fences 554 in the piezoelectric plate 532 and in the intervening oxide layer 536 to the substrate 537 at a desired location for a perimeter 535 of a cavity in the intervening oxide layer 536. Step 550 and/or 560 may be filling the trenches 533 with a metal material to form lateral fences 554 bounding an intended location 527 for a cavity. Lateral fences 554 may be an etch-stop material having a width W1 of between 0.1 um and 10 um. Lateral fences 554 may have a shape, width and depth as described for trenches 533. One example is top perspective view 620 of large rectangular cavity location 527 between rectangular wall fences 554 and having circular holes 538 in FIG. 6A.

The lateral fences 554 may be contiguous with the surrounding material of portion 519 outside of the locations 527. The lateral fences 554 may be formed by filling the trenches 533 with one or more fence materials. The fence material or materials may be grown on the substrate and/or deposited onto the substrate using conventional deposition processes such as sputtering, or chemical vapor deposition. Step 550 may use atomic layer deposition (ALD), physical vapor deposition (PVD) or chemical vapor deposition (CVD). In some cases, the fence material or materials may be any material that will function to constrain the lateral or horizontal growth of the cavity 587 when the cavity is etched in the layer 536.

Next, step 570 is a photolithographic patterning of openings 573 in a mask on the piezoelectric plate 532 to form pattern 571. Pattern 571 covers the fences 554 but has openings 573 that expose the holes 538. The pattern 571 may be a photolithography mask having openings that include openings 573 exposing desired locations for the holes 538 at desired locations 527 for cavities. The mask may be a patterned photoresist formed on the plate 532 that is capable of masking an etch of the intervening oxide layer at step 580. The mask may be a suitable mask such as a photoresist mask or a hard mask. Step 570 may be forming one or more holes 538 through the piezoelectric plate within the perimeter 535.

Step 570 may be a photolithography process to etch openings to or at etch holes 538 to be used to etch cavity 587. Patterning at 570 may be forming holes 538 through the piezoelectric plate 532 within the perimeter 535 for a cavity 587. Step 570 is optional and may not be performed when cavity 587 can be selectively etched at step 580 with respect to the plate 532, fences 554 and substrate 537.

Step 580 is a patterned etching through the openings 573, and/or through the holes 538 extending through the piezoelectric plate 532 to remove the intervening oxide layer 536 within the perimeter 535 to define the cavity 587. Step 580 release the membrane including diaphragm 589 from the intervening oxide layer 536 and the substrate 537. Etching at 580 may be selectively etching material of layer 536 with respect to material of pattern 571, plate 532, fences 554 and substrate 537 to form the cavity.

Step 580 may include using the etch-stop material of fences 554 and using the substrate material of substrate 537 as an etch stop during an etching process to etch away thickness D1 of the oxide layer 536 to frontside membrane release (FSMR) a membrane having diaphragm 589 of the plate over the cavity 587.

Step 580 may be removing the intervening oxide layer 536 within the perimeter 535 to form the cavity using an etchant introduced through the holes 538. Step 580 may be etching a cavity 587 in the substrate using an etchant introduced through the holes 538. At step 580, the intervening oxide layer 536 may be a material capable of being etched by an etch process; and the lateral fences 554 and substrate 537 are substantially impervious to the etch process.

If a bonding layer exists, it may or may not be removed during etching to form the cavities. If it is removed its removal may require a separate etch step and chemistry. Removal of the bonding layer may or may not remove all or part of the lateral fences and/or of substrate 537 beneath the cavities.

Step 580 may be a buried oxide etch (BOE) of SiO2 layer 536 to release diaphragm 589. Steps 570 and 580 may be a photolithography process to pattern openings 573 and etch through holes 538 using conventional photolithographic technique, such as noted at step 430. These descriptions will not be repeated.

Etching at steps 570 and 580 may use a photolithography etch, or mask and etch process. These steps may etch the cavity 587 through a suitable mask 571 such as a photoresist mask or a hard mask. The cavity 587 may be etched into the portion 519 using a suitable wet or dry etching process for the layer 536 material. The cavity 587 may be etched using a liquid or gaseous etchant introduced via the openings 573.

For example, when the layer 536 is silicon oxide, the trenches may be formed using deep reactive ion etching (DRIE). Other etching processes may be used on other substrate materials. In other cases, etching may be etching with XeF2. Etching at 570 and/or 580 may use an oxide wet etchants such as NH4F/HF 6:1 ratio and/or H20/HF/HNO3 60:3:2 ratio.

Etching at 580 may be forming the cavity 587 by removing the intervening oxide layer material from a volume bounded by the piezoelectric plate 532, the substrate 537, and the lateral fences 554 using an etchant introduced through one or more holes 538 in the piezoelectric plate 532. The lateral growth of the cavity is constrained by the lateral etch-stop fences 554. The depth D1 of the cavity is limited by the substrate 537, which functions as the vertical etch-stop.

Etching at step 580 may use a photolithography etch, or pattern 571 and etch process. In case where the pattern 571 does not exist, the plate 532 is impervious to the etch chemistry and thus acts as a de-facto mask.

Step 580 may include removing pattern 571 (when it exists) after etching the cavity 587. Step 580 may include removing photoresist 571 and cleaning the top surface of plate 532. The cleaning may include planarizing or polishing the top surface as noted herein.

The top perspective perimeter shape of the cavity 587 may be rectangular, oval, square or another shape. It may be a shape noted for the top perspective shape of the trenches or lateral fences. One example is top perspective view 630 of large rectangular cavity 587 between rectangular wall fences 554 and having circular holes 538 in FIG. 6B. This top perspective view 630 may be after pattern 571 is removed.

After step 560 and/or 580, locations 527 and/or cavity 587, respectively, may be a volume (e.g., a volume of a layer 536) that has a length L (into the drawing page and not shown) of between 50 um and 500 um between length inside surfaces of the lateral fences 554; a width W of between 50 um and 500 um between width inside surfaces of the lateral fences; and a depth D1 of between 1 um and 100 um between a bottom surface of the plate and a top surface of the substrate. In some cases, width W is between 80-100 um wide; and length L is between 10 and 100 um long. Width W could be as small as 50 μm (e.g., on the sides of a typical resonator) to as large as 500 μm (e.g., on the top and bottom). A broader range may be from 5 μm to 7 mm. The volume of material may be etched to form the cavities.

At step 590, conductor pattern 592 is formed on the surface of the piezoelectric plate 532. The conductor pattern 592 include IDTs of a respective resonators and the interleaved fingers 594 of the IDTs are disposed on a respective diaphragm having membrane 589 over or spanning a cavity 587. The structure of and techniques for forming the conductor patterns were previously described for action 430 in the process 400 of FIG. 4. These descriptions will not be repeated. The piezoelectric plate and the IDTs are configured such that a radio frequency signal applied to an IDT excites a primary shear acoustic mode in the diaphragm.

In some cases, at step 590, one or more dielectric layers (not shown) may be formed on the surface of the piezoelectric plate 532 beside or over the conductor pattern 592. The dielectric layers may include a layer selectively formed over the IDT fingers of shunt resonators. The structure of and techniques for forming the dielectric layers were previously described for action 440 in the process 400 of FIG. 4. These descriptions will not be repeated.

Step 590 may be a device fabrication process, such as noted at step 430. These descriptions will not be repeated. One example is top perspective view 630 of large rectangular cavity 587 between rectangular wall fences 554 and having circular holes 538 in FIG. 6B. This top perspective view 630 may be after pattern 571 is removed.

The filter device is then completed at 595. Actions that may occur at 595 include depositing an encapsulation/passivation layer such as $SiO_2$ or $Si_3O_4$ over all or a portion of the device and/or forming bonding pads or solder bumps or other means for making connection between the device and external circuitry if these steps were not performed at 590. Other actions at 595 may include excising individual devices from a wafer containing multiple devices; other packaging steps; and testing. Another action that may occur at 590 is to tune the resonant frequencies of the resonators within the device by adding or removing metal or dielectric material from the front side of the device. After the filter device is completed, the process ends. Step 595 may be a completing the device process, such as noted at step 460. These descriptions will not be repeated.

Figure 6A:
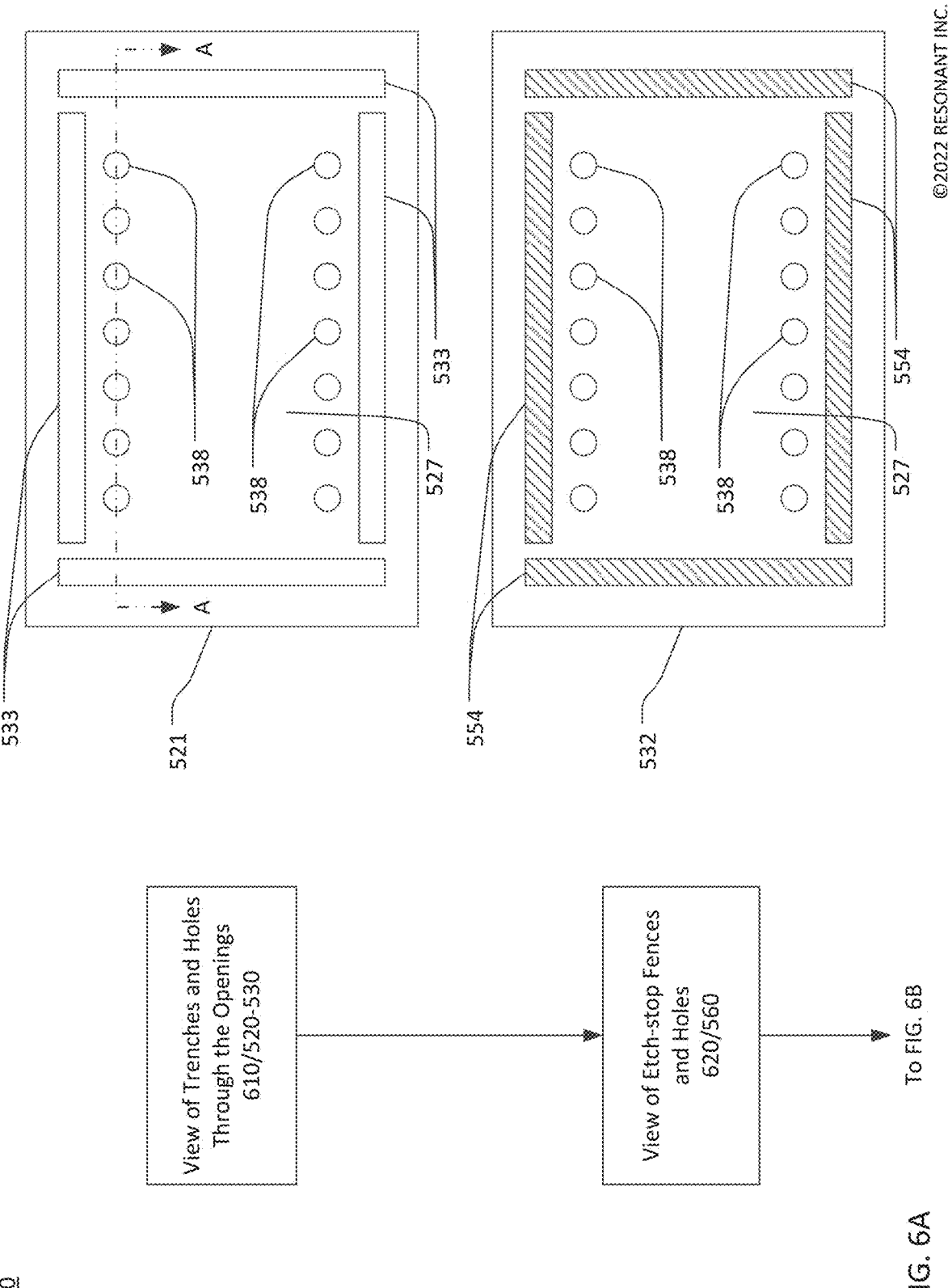
FIG. 6A and FIG. 6B are a simplified flow chart of top perspective views for fabricating an acoustic resonator device or an XBAR.
Figure 6B:
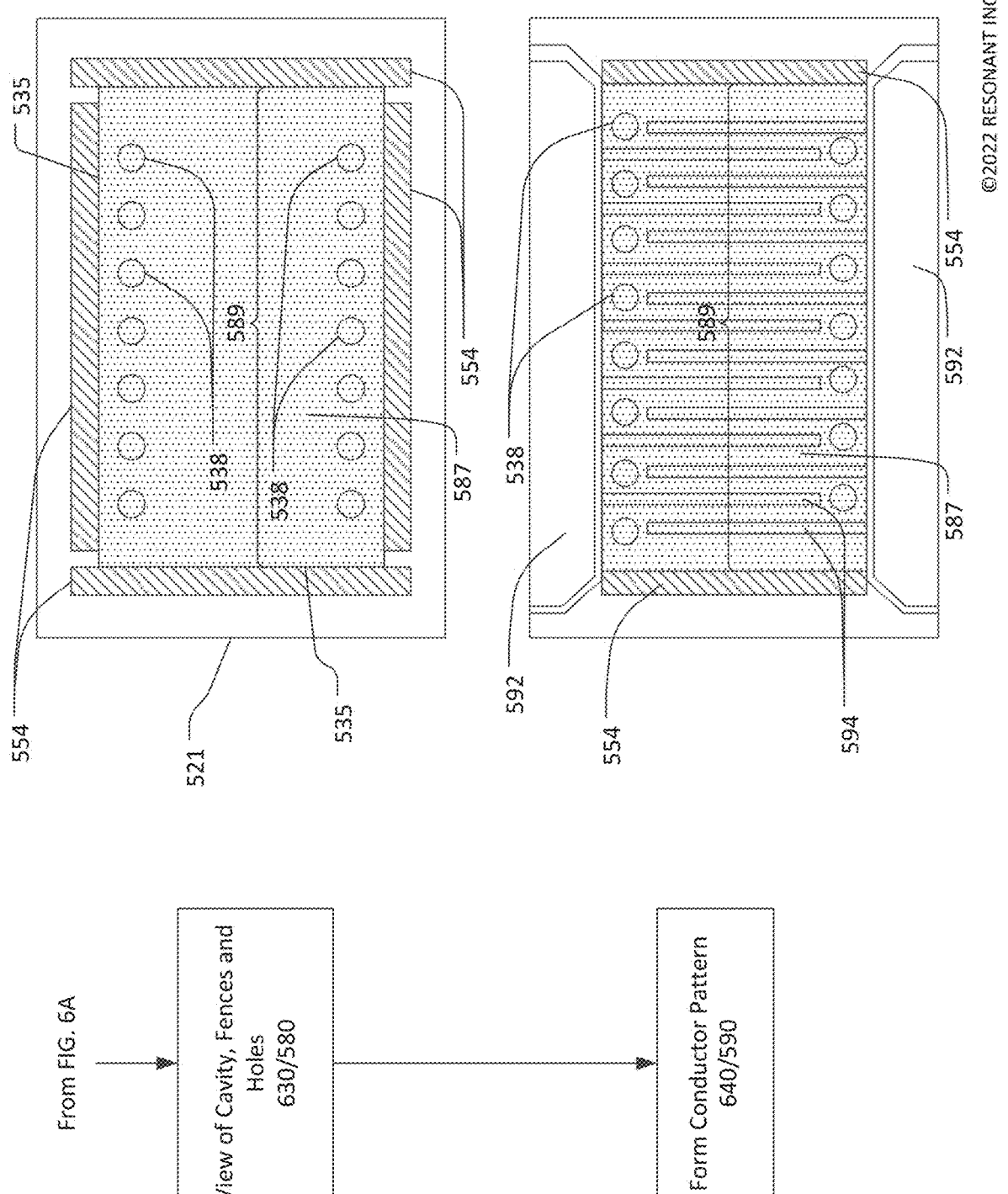

FIG. 6A and FIG. 6B are a simplified flow chart of top perspective views 600 for fabricating an acoustic resonator device or an XBAR. To the right of each view description is a top perspective view representing the description. The views 600 starts at view 610 in FIG. 6A and end at view 640 in FIG. 6B with a completed resonator or filter device.

FIG. 6A-6B are schematic perspective views 610-640 of some of the cross sectional views of FIG. 5A-C. The schematic cross sectional views of FIG. 5A-C are through perspective A-A as shown in view 610. Views 610-640 include additional locations for holes 538 (e.g., more than 2 holes) not shown in FIGS. 5A-C.

Top perspective view 610 of FIG. 6A shows trenches 533 and holes 538 formed through pattern 521 and to substrate 537 at step 530. Top perspective view 610 shows large rectangular cavity location 527 between long rectangular shaped trenches 533 and at circular holes 538. In other cases, view 610 may correspond to step 520 where the openings 523 are at the locations for holes and the openings 528 are at the locations for trenches.

Top perspective view 620 of FIG. 6A shows fences 554 and holes 538 formed through plate 512 and to substrate 537 at step 560. Top perspective view 620 shows large rectangular cavity location 527 between long rectangular shaped fences 554 and at circular holes 538.

Top perspective view 630 shows large rectangular cavity 587 formed at step 580 between long rectangular shaped fences 554 and at circular holes 538. Large rectangular cavity 587 is between plate 532 and substrate 537. Large rectangular cavity 587 may be an empty volume of space or air. Top perspective view 630 may shows the cavity under, fences through and holes through pattern 571 and to substrate 537. In other cases, view 630 may correspond to step 580 after pattern 571 is removed and shows the cavity under, fences through and holes through plate 532 and to substrate 537.

Top perspective view 640 shows conductor pattern 592 formed on the surface of the piezoelectric plate 532 at step 590. The conductor pattern 592 include IDTs of a respective resonators and the interleaved fingers 594 of the IDTs are disposed on a respective diaphragm or membrane 589 over or spanning a cavity 587. The IDT may include busbars at the locations marked with "592". Large rectangular cavity 587 is as noted at view 630.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
a substrate having a surface, the substrate comprising a substrate material;
an intervening oxide layer on the surface of the substrate and having a cavity, a thickness of the intervening oxide layer defining a depth of the cavity, the substrate comprising a vertical etch-stop material that includes silicon;
a piezoelectric layer having opposing front and back surfaces, the back surface attached to the intervening oxide layer and the piezoelectric layer having a portion that forms a diaphragm that is over the cavity in the intervening oxide layer;
an interdigital transducer (IDT) on the front surface of the piezoelectric layer and having interleaved fingers on the diaphragm; and
lateral fences in the piezoelectric layer and intervening oxide layer that define a perimeter of the cavity, the lateral fences comprising a lateral etch-stop material that includes at least one of silicon oxide, silicon nitride, aluminum oxide, oxynitride, chromium, aluminum and platinum,
wherein the piezoelectric layer includes one or more holes extending therethrough and that do not overlap the lateral fences in a direction perpendicular to the surface of the substrate.

2. The device of claim 1 wherein the intervening oxide layer comprises a device layer thickness of silicon oxide material on the silicon substrate.

3. The device of claim 1 wherein:
the piezoelectric layer and the IDT are configured such that a radio frequency signal applied to the IDT excites a primary shear acoustic mode in the diaphragm,
the primary shear acoustic mode is a bulk shear mode where acoustic energy propagates along a direction substantially orthogonal to the front and back surfaces of piezoelectric layer, which is also transverse to a direction of an electric field generated by the interleaved fingers of the IDT, and
the piezoelectric layer comprising one of lithium niobate and lithium tantalate.

4. The device of claim 1 wherein the substrate comprises:
a device portion having the intervening oxide layer, wherein the cavity extends from the back surface of the piezoelectric layer through the device portion to the substrate.

5. The device of claim 4 wherein:
the substrate is silicon; and
the intervening oxide layer is silicon dioxide.

6. The device of claim 1 wherein:
the cavity is formed by a frontside membrane release etch process that etches the intervening oxide layer; and
the lateral fences and substrate are substantially impervious to the etch process.

* * * * *